(12) United States Patent
Shrier et al.

(10) Patent No.: US 6,239,687 B1
(45) Date of Patent: *May 29, 2001

(54) VARIABLE VOLTAGE PROTECTION STRUCTURES AND METHOD FOR MAKING SAME

(75) Inventors: Karen P. Shrier, Fremont; Gerald R. Behling, San Jose; Kailash C. Joshi, Milpitas; William W. Alston, Jr., Sunnyvale, all of CA (US)

(73) Assignee: Surgx Corporation, Fremont, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/943,189

(22) Filed: Oct. 3, 1997

Related U.S. Application Data

(62) Division of application No. 08/790,250, filed on Jan. 28, 1997, which is a continuation of application No. 08/275,947, filed on Jul. 14, 1994, now abandoned.

(51) Int. Cl.$^7$ ...................................................... H01C 7/13
(52) U.S. Cl. ................................ 338/21; 338/20; 361/127
(58) Field of Search ........................ 338/20, 21; 361/127

(56) References Cited

U.S. PATENT DOCUMENTS

| | | | |
|---|---|---|---|
| 2,067,393 | * 1/1937 | Habaan | 338/20 |
| 2,796,505 | * 6/1957 | Bocciarelli | 338/20 |
| 3,212,043 | * 10/1965 | Johnson | 338/20 |
| 3,571,777 | * 3/1971 | Tully | 338/20 |
| 3,813,639 | 5/1974 | Schurter et al. | 339/111 |
| 4,331,948 | 5/1982 | Malinaric et al. | 338/21 |
| 4,726,991 | 2/1988 | Hyatt et al. | 428/329 |
| 4,770,738 | 9/1988 | Robillard | 156/608 |
| 4,813,891 | 3/1989 | Walters et al. | 439/620 |
| 4,928,199 | 5/1990 | Diaz et al. | 361/56 |
| 4,939,619 | 7/1990 | Borkowicz et al. | 361/117 |
| 4,977,357 | 12/1990 | Shrier | 338/21 |
| 4,992,333 | * 2/1991 | Hyatt | 338/21 |
| 5,008,770 | 4/1991 | Hilland | 361/56 |
| 5,068,634 | 11/1991 | Shrier | 338/21 |
| 5,089,929 | 2/1992 | Hilland | 361/111 |
| 5,101,317 | 3/1992 | Cwirzen et al. | 361/119 |
| 5,130,881 | 7/1992 | Hilland | 361/56 |
| 5,142,263 | 8/1992 | Childers et al. | 338/21 |
| 5,175,662 | 12/1992 | DeBalko et al. | 361/119 |
| 5,183,698 | 2/1993 | Stephenson et al. | 428/209 |
| 5,189,387 | 2/1993 | Childers et al. | 338/20 |

(List continued on next page.)

OTHER PUBLICATIONS

Patent Abstracts of Japan, vol. 17, No. 257 (E–1368), May 20, 1993 and JP,A,05 00314 (Murata Mfg Co Ltd), Jan. 8, 1993.

Machine Design, vol. 55, No. 27, Nov. 1983, Cleveland, Ohio, USA, pp. 87–91, XP002004500, Ben Carlisle: "Solving Problems with Elastomeric Connectors".

Primary Examiner—Karl D. Easthom
(74) Attorney, Agent, or Firm—Burns, Doane, Swecker & Mathis, LLP

(57) ABSTRACT

A variable voltage protection component is provided with a reinforcing layer of insulating material having a substantially constant thickness embedded in a voltage variable material. The reinforcing layer defines a uniform thickness for the variable voltage protection component that is resistant to compressive forces that may cause a reduction in the clamp voltage or a short in the voltage variable material. In addition, the variable voltage protection device component can be attached to a compressible ground plane to form a variable voltage protection device.

12 Claims, 7 Drawing Sheets

U.S. PATENT DOCUMENTS

| | | | | |
|---|---|---|---|---|
| 5,195,010 | | 3/1993 | Dresner | 361/56 |
| 5,208,723 | | 5/1993 | Jenne | 361/119 |
| 5,225,265 | * | 7/1993 | Prandy et al. | 428/138 |
| 5,229,037 | | 7/1993 | Nakano et al. | 252/512 |
| 5,246,388 | | 9/1993 | Collins et al. | 439/620 |
| 5,248,517 | | 9/1993 | Shrier et al. | 427/58 |
| 5,260,848 | | 11/1993 | Childers | 361/127 |
| 5,262,754 | * | 11/1993 | Collins | 338/21 |
| 5,278,535 | * | 1/1994 | Xu et al. | 338/20 |
| 5,294,374 | * | 3/1994 | Martinez et al. | 338/21 |
| 5,393,597 | * | 2/1995 | Childers et al. | 338/21 |
| 5,416,662 | | 5/1995 | Kurasawa et al. | 361/118 |
| 5,444,593 | | 8/1995 | Allina | 361/56 |
| 5,476,714 | * | 12/1995 | Hyatt | 338/20 |
| 5,483,407 | | 1/1996 | Anastasio et al. | 361/56 |
| 5,742,223 | * | 4/1998 | Simendinger, III et al. | 338/21 |

* cited by examiner

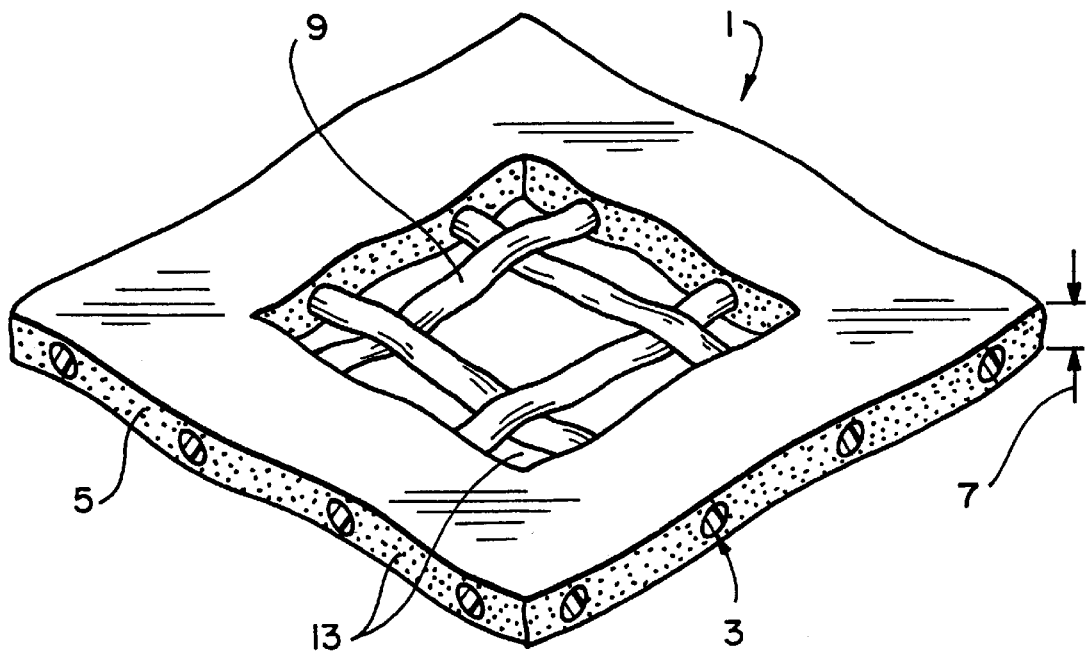
FIG_1
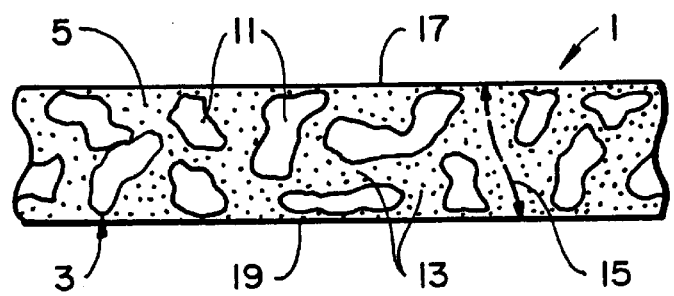
FIG_2
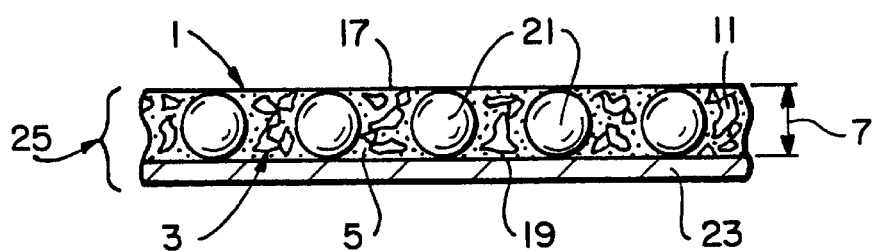
FIG_3

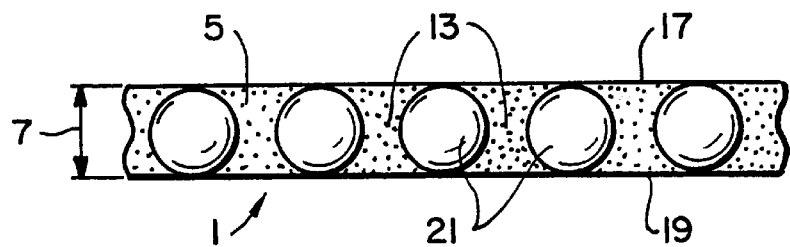
FIG_4
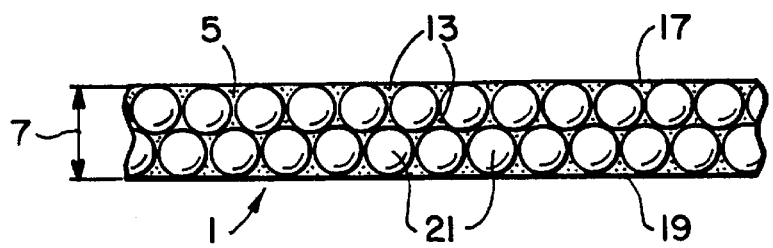
FIG_5
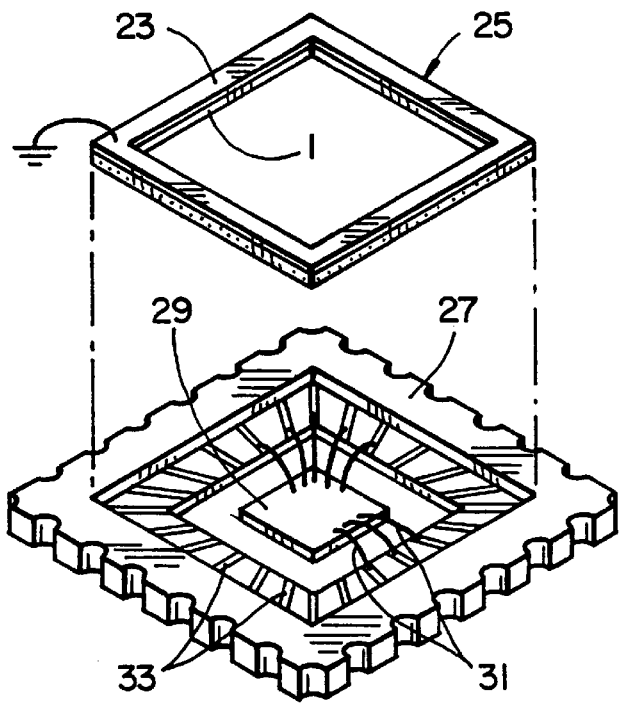
FIG_6

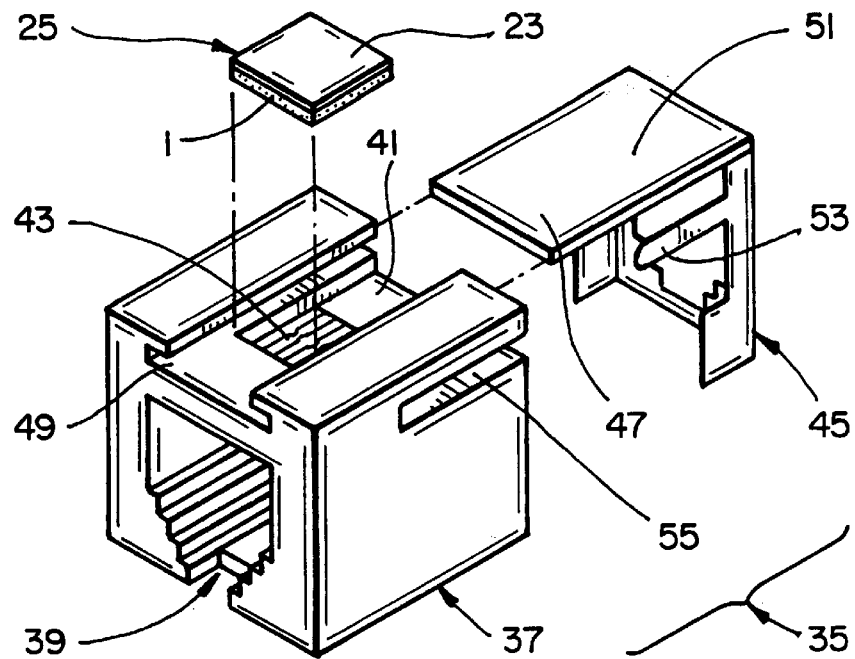
FIG_7
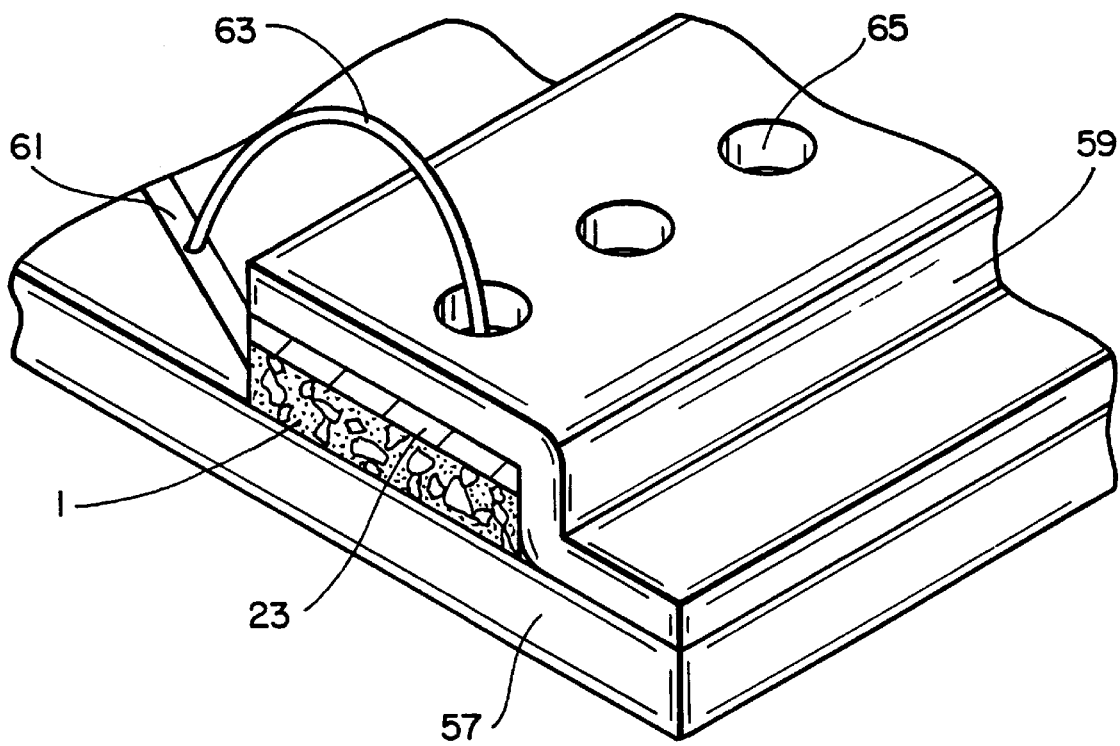
FIG_8

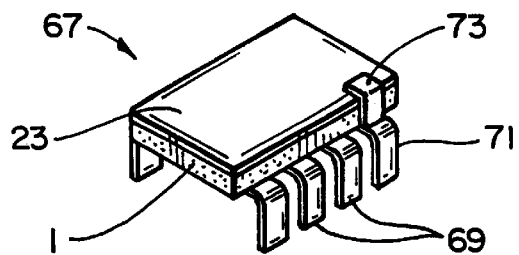
FIG_9
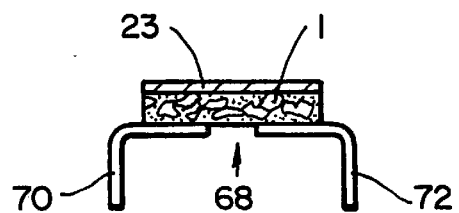
FIG_9A
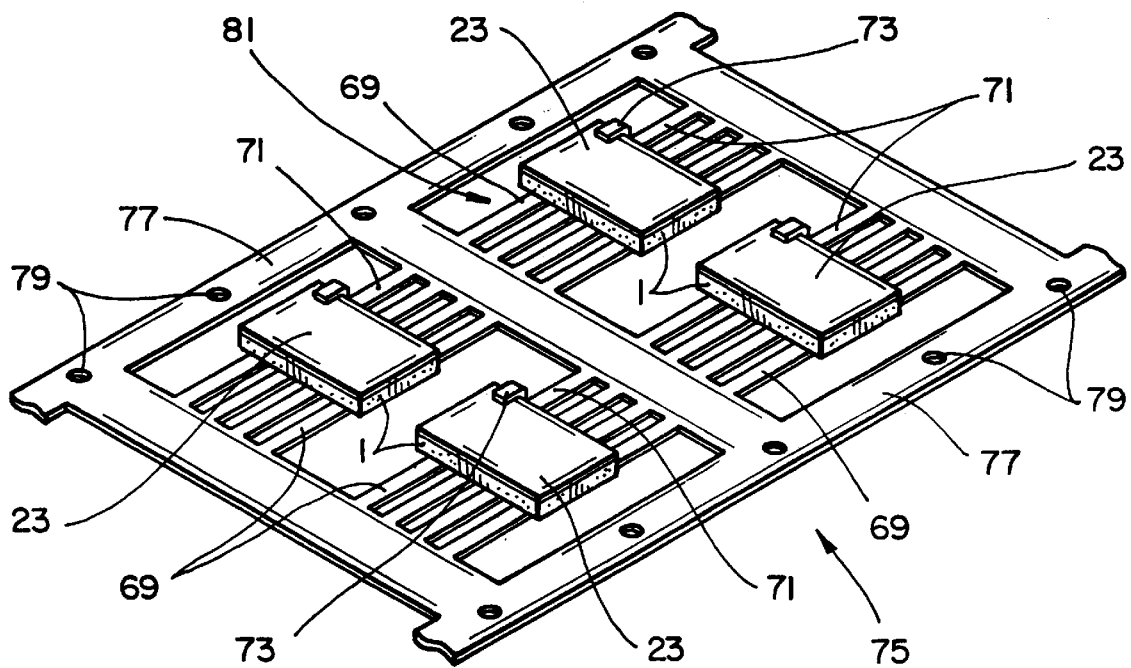
FIG_10

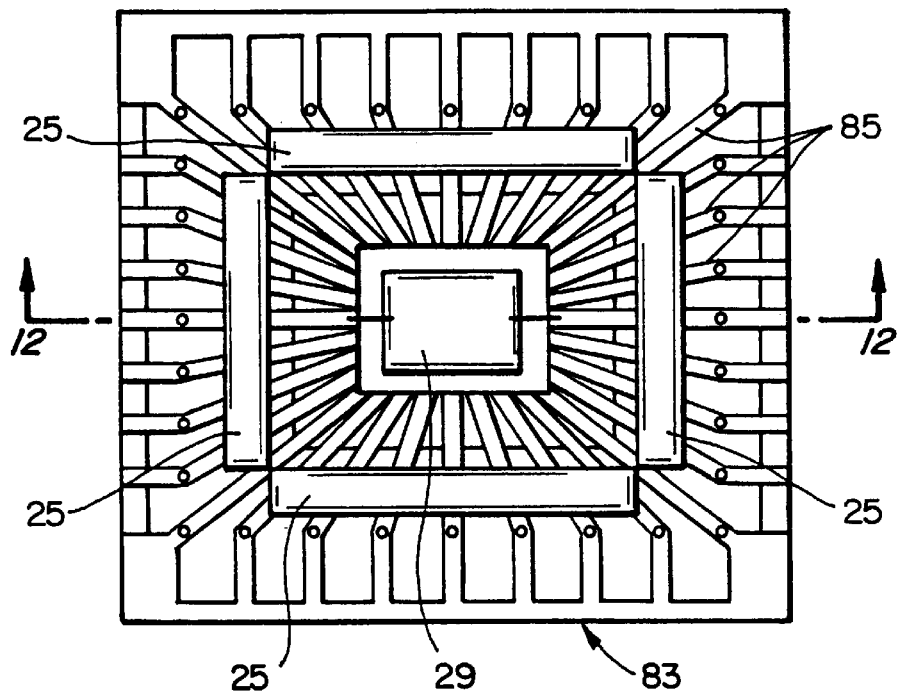
FIG_11
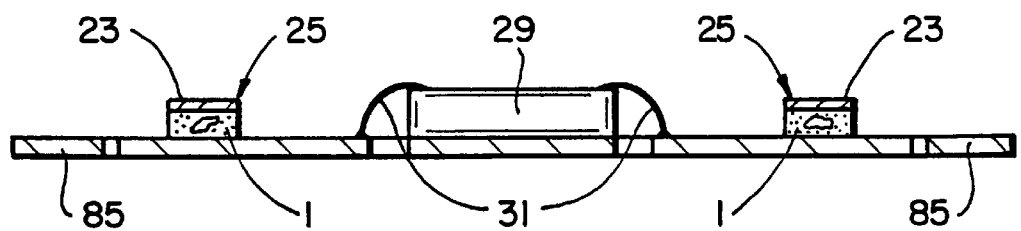
FIG_12
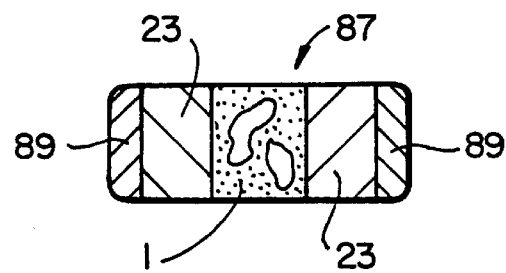
FIG_13

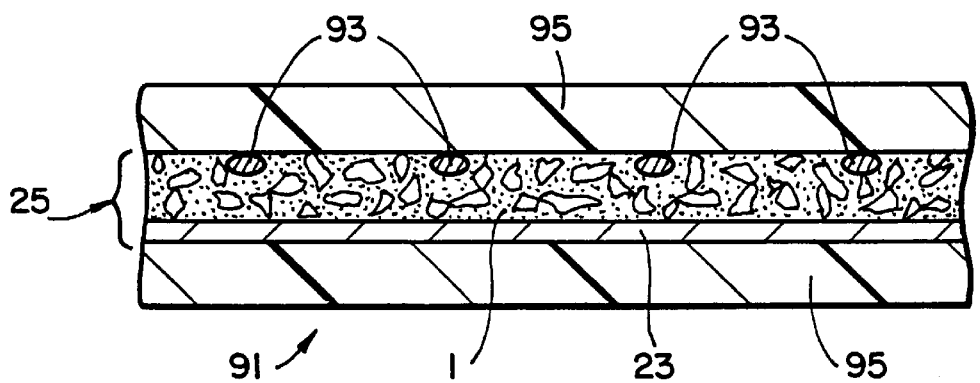
FIG_14
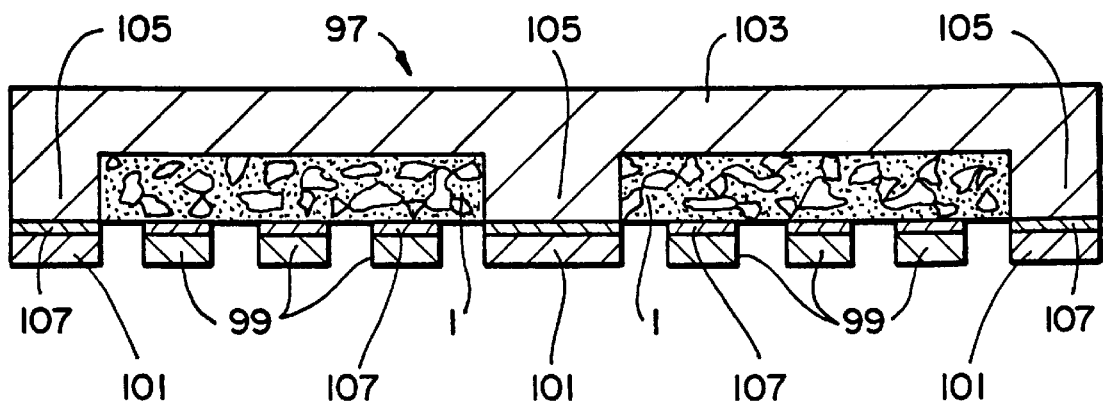
FIG_15

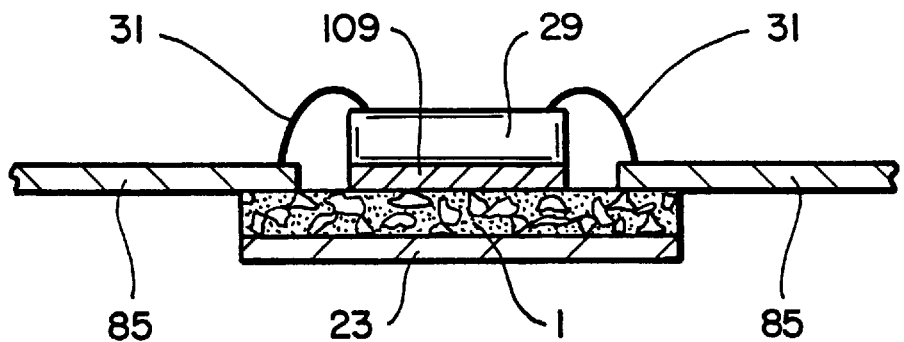
FIG_16
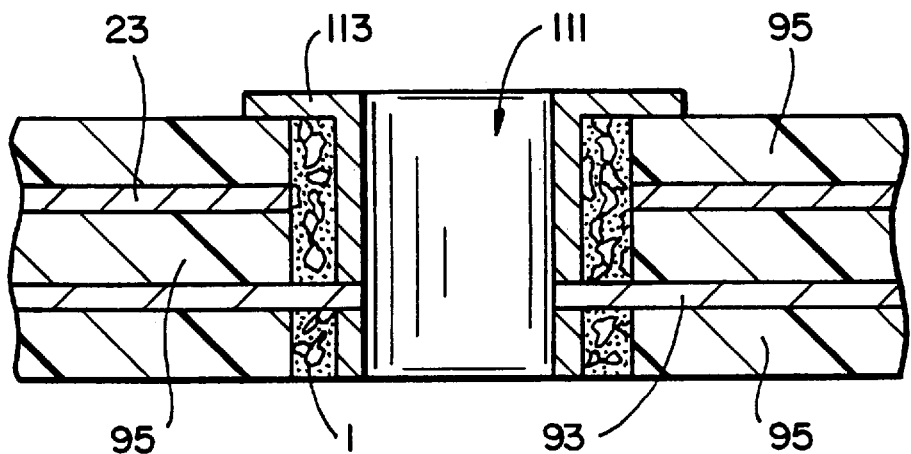
FIG_17
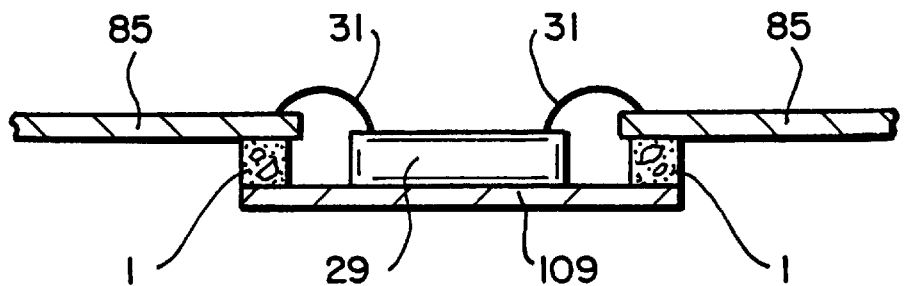
FIG_18

VARIABLE VOLTAGE PROTECTION STRUCTURES AND METHOD FOR MAKING SAME

This application is a divisional, of application Ser. No. 08/790,250, filed Jan. 28, 1997, which is a File-Wrapper-Continuing application of Ser. No. 08/275,947, now abandoned filed Jul. 14, 1994.

FIELD OF THE INVENTION

The present invention relates generally to variable voltage protection devices used to protect electronic circuits from overvoltage transients caused by lightning, electromagnetic pulses, electrostatic discharges, ground loop induced transients, or inductive power surges. The present invention relates particularly to a variable voltage protection component with a substantially constant thickness for assembly in a variable voltage protection device.

BACKGROUND OF THE INVENTION

Voltage transients can induce very high currents and voltages that can penetrate electrical devices and damage them, either causing hardware damage such as semiconductor burnout, or electronic upset such as transmission loss or loss of stored data. The voltage transients produce large voltage spikes with high peak currents (i.e, over-voltage). The three basic over-voltage threats are electrostatic discharge, line transients, and lightning. Electrostatic discharge typically occurs when static charge dissipates off the body of a person in direct physical contact with an operating electronic system or integrated circuit chip. Line transients are surges in AC power lines. Line transients can also occur due to closing a switch or starting a motor. Lightning strikes can strike stationary objects, such as a building, or mobile objects such as aircraft or missiles. Such strikes can suddenly overload a system's electronics. At peak power, each of these threats is capable of destroying the sensitive structure of an integrated circuit chip.

Various overvoltage protection materials have been used previously. These materials are also known as nonlinear resistance materials and are herein referred to as voltage variable material. In operation, the voltage variable material initially has high electrical resistance. When the circuit experiences an overvoltage spike, the voltage variable material quickly changes to a low electrical resistance state in order to short the overvoltage to a ground. After the overvoltage has passed, the material immediately reverts back to a high electrical resistance state. The key operational parameters of the voltage variable material are the response time, the clamp voltage, and the voltage peak. The time it takes for the voltage variable material to switch from insulating to conducting is the response time. The voltage at which the voltage variable material limits the voltage surge is called the clamp voltage. In other words, after the material switches to conducting, the material ensures that the integrated circuit chip, for example, will not be subjected to a voltage greater than the clamp voltage. The voltage at which the voltage variable material will switch (under surge conditions) from insulating to conducting is the switch voltage. These materials typically comprise finely divided particles dispersed in an organic resin or insulating medium. For example, U.S. Pat. No. 4,977,357 (Shrier) and U.S. Pat. No. 4,726,991 (Hyatt et al.) disclose such materials.

Voltage variable materials and components containing voltage variable materials have been incorporated into overvoltage protection devices in a number of ways. For example, U.S. Pat. No. 5,142,263 and 5,189,387 (both issued to Childers et al.) disclose a surface mount device which includes a pair of conductive sheets and voltage variable material disposed between the pair of conductive sheets. U.S. Pat. No. 4,928,199 (Diaz et al.) discloses an integrated circuit chip package which comprises a lead frame, an integrated circuit chip protected by an electrode cover which is connected to ground on one side, and a variable voltage switching device including the voltage variable material connected to the electrode cover on the other side. U.S. Pat. No. 5,246,388 (Collins et al.) is directed to a device having a first set of electrical contacts that interconnect with signal contacts of an electrical connector, a second set of contacts that connect to a ground, and a rigid plastic housing holding the first and second set of contacts so that there is a precise spacing gap to be filled with the overvoltage material. U.S. Pat. No. 5,248,517 (Shrier et al.) discloses painting or printing the voltage variable material onto a substrate so that conformal coating with voltage variable material of large areas and intricate surfaces can be achieved. By directly printing the voltage variable material onto a substrate, the voltage variable material functions as a discreet device or as part of the associated circuitry.

It is commonly known in the art that the thickness of the voltage variable material and volume of the material are important to performance. See U.S. Pat. No. 4,977,357 issued to Shrier, U.S. Pat. No. 4,928,199 issued to Diaz et al. and U.S. Pat. No. 4,726,991 issued to Hyatt et al. Likewise, it is known that the clamp voltage is reduced or the voltage variable material can short out if put under pressure. See U.S. Pat. No. 5,248,517 issued to Shrier et al. Therefore, there has been a long felt need in the art to accurately and cost-effectively produce a variable voltage protection component having a uniform thickness of voltage variable material and to prevent shorts or variations in the clamp voltage if pressure is applied to the material. In addition to these qualities, it is desirable to have the voltage variable material be continuous across at least one of the surfaces of the variable voltage protection component for universal application of the component, for example, across a single circuit line or multiple circuit lines.

U.S. Pat. No. 5,262,754 (Collins) discloses an overvoltage protection element that can replace discrete devices presently used in protecting electronic circuits. The overvoltage protection element includes a layer of insulating material having first and second spaced major surfaces spaced a predetermined distance to determine the thickness of the element, a plurality of spaced holes extending between the major surfaces, and an overvoltage protection material contained within the holes formed in the layer of insulating material and extending between the spaced major surfaces. The spaced holes are formed by perforating the layer of insulating material by mechanical punching, laser processing and cutting, chemical etching, etc. The holes are formed in a pattern and should be wider than about one-half the width of the associated electrical circuit to which the holes will overlay. The spacing of the holes is determined by the spacing of the leads in the electrical circuit.

The above U.S. Patents referred to are incorporated herein by reference.

Although the prior art discloses various materials and devices, there is a continuing and long felt need to provide improved cost-effective voltage variable materials and devices of more consistent performance properties to prevent variations in the clamp voltage under various conditions in which the materials and devices are used.

SUMMARY OF THE INVENTION

The present invention provides a variable voltage protection component for use in a variable voltage protection device, more particularly a variable voltage protection component with an accurately controlled uniform thickness of voltage variable material that is resistant to pressure applied to the component. The present invention also provides a variable voltage protection device comprising the variable voltage protection component attached to a compressible conductive ground plane that is flexible so that the device will conform to irregular surfaces.

A variable voltage protection component in accordance with this invention comprises a reinforcing layer of insulating material having a substantially constant thickness impregnated with a voltage variable material. With this configuration, the reinforcing layer defines a uniform thickness for the variable voltage protection component that is resistant to compressive forces that may cause a reduction in the clamp voltage or a short in the voltage variable material. In addition, the voltage variable material can be continuous across at least one surface of the variable voltage protection component for universal application to electronic circuits.

In accordance with one aspect of the present invention, a variable voltage protection component for placement between a system ground and an electronic circuit is provided comprising a voltage variable material, and a reinforcing layer having a substantially constant thickness embedded in the variable voltage material.

In accordance with another aspect of the present invention, a variable voltage protection component for placement between a system ground and an electronic circuit is provided comprising a reinforcing layer having a substantially constant thickness, comprising a plurality of pieces of insulating material, said plurality of pieces defining a plurality of voids therebetween, and a voltage variable material impregnating the reinforcing layer and filling the plurality of voids.

In accordance with yet another aspect of the present invention, a variable voltage protection device for use in combination with a system ground is provided comprising a variable voltage protection component, and a compressible conductive ground plane contacting the variable voltage protection component.

In one of its method aspects, a method for making a variable voltage protection device is provided, comprising providing a variable voltage protection material having a reinforcing layer of substantially constant thickness, providing a conductive substrate, depositing on the conductive substrate the variable voltage protection material containing the reinforcing layer.

In another one of its method aspects, a method for making a variable voltage protection device is provided comprising providing a conductive substrate having a reinforcing layer of substantially constant thickness on a surface of the substrate and impregnating in the reinforcing layer a variable voltage protection material.

In yet another one of its method aspects, a method of making a variable voltage protection device is provided comprising providing a compressible conductive ground plane, providing a variable voltage protection material, and depositing the variable voltage protection material on the compressible conductive ground plane.

BRIEF DESCRIPTION OF THE DRAWINGS

Many objects and advantages of the present invention will be apparent to those of ordinary skill in the art when this specification is read in conjunction with the attached drawings. The invention will now be described with reference to the accompanying drawings wherein like reference numerals are applied to like elements and wherein:

FIG. 1 is a partial cross-sectional perspective view of one embodiment of the variable voltage protection component with a center portion removed to show the reinforcing layer is a woven glass mat;

FIG. 2 is a cross-sectional view of another embodiment of the present invention wherein the reinforcing layer is non-woven glass mat;

FIG. 3 is a cross-sectional view of another embodiment of the present invention mounted on a conductive ground plane wherein the reinforcing layer is non-woven glass mat with spacers;

FIG. 4 is a cross-sectional view of yet another embodiment of the present invention wherein the reinforcing layer is sized spacers;

FIG. 5 is a cross-sectional view of the variable voltage protection component of FIG. 4 with smaller sized spacers;

FIG. 6 is a perspective view of an integrated circuit chip carrier utilizing the present invention;

FIG. 7 is a perspective view of a telephone connector utilizing the present invention;

FIG. 8 is a partial cross-sectional perspective view of the present invention installed on the edge of a printed circuit board;

FIG. 9 is a perspective view of a standard packaged variable voltage protection device in accordance with the present invention;

FIG. 9A is a cross-sectional view of another embodiment of a standard packaged variable voltage protection device in accordance with the present invention;

FIG. 10 is a perspective view of a lead frame for producing variable voltage protection devices;

FIG. 11 is an integrated circuit chip lead frame with a variable voltage protection component of the present invention installed;

FIG. 12 is a cross-sectional view of the chip lead frame of FIG. 11 along line 12—12;

FIG. 13 is a discrete variable voltage protection component in accordance with the present invention;

FIG. 14 is a cross-sectional view of a printed circuit board with the variable voltage protection component of the present invention laminated in the printed circuit board;

FIG. 15 is a cross-sectional view of another device utilizing the variable voltage protection component of the present invention to contact a predetermined pattern of leads;

FIG. 16 is a cross-sectional view of an integrated circuit chip lead frame with a variable voltage protection component of the present invention installed across a die pad ground;

FIG. 17 is a cross-sectional view of an alternate embodiment of a printed circuit board utilizing the variable voltage protection component of the present invention; and FIG. 18 is a cross-sectional view of another embodiment of an integrated circuit chip lead frame with a variable voltage protection component installed.

DETAILED DESCRIPTION OF THE INVENTION

In one embodiment of the present invention (FIG. 1), there is provided a variable voltage protection component 1 comprising a reinforcing layer 3 embedded in the voltage variable material 5, or in other words the reinforcing layer is impregnated with the voltage variable material. The reinforcing layer 3 has low compressibility and is selected to be of predetermined thickness so that the variable voltage protection component 1 will have a predetermined uniform thickness 7. By using the reinforcing layer 3 to achieve a uniform thickness, repeatable electrical performance can be achieved.

Preferably, the reinforcing layer 3 is a low compressibility fabric which has a low coefficient of thermal expansion and a low dielectric constant. By serving a mechanical reinforcing function, as distinguished from the electrical protection function of the voltage variable material 5, the reinforcing layer 3 can be considered to be electrically inert. As such, in one embodiment of the present invention, where the reinforcing layer 3 is electrically inert, the reinforcing layer 3 does not provide electrical functionality. The reinforcing layer 3 can be any of a number of insulating materials including, but not limited to, a porous polymer support material such as referred to in U.S. Pat. No. 4,950,546 (Dubrow et al.) and disclosed in U.S. patent application Ser. No. 711,119 filed Mar. 12, 1985, (equivalent disclosure published as European Patent Application EP 194872 on Sep. 17, 1986), porous synthetic resin polymer tape such as that sold under the trademark "TEFLON" (manufactured by E. I. du Pont de Nemours & Co., Wilmington, Del.), polypropylene, glass, aromatic polyamide such as that sold under the trademark "KEVLAR" (manufactured by E. I. du Pont de Nemours & Co., Wilmington, Del.), polyester, thermoplastic polymer, thermosetting polymer, epoxy, and ceramic. The reinforcing layer 3 can be comprised of fibrous pieces of insulating material 9 forming a mat as shown in FIG. 1 or particulate pieces of insulating material 11 forming a non-woven mat as shown in FIG. 2. The non-woven mat can be comprised of random particulate pieces pressed or bonded together to form a sheet. The pieces can be pressed and aligned so as to be all substantially horizontal. Further, the non-woven mat can be the woven fibers of the mat shown in FIG. 1 broken, cut or chopped into smaller pieces. In addition, the fibers or pieces of insulating material can be coated with a metal coating provided that they are distributed so as to not create a short or can be metal particles coated with insulating materials.

The reinforcing layer 3 includes a number of voids or spaces 13 between the pieces 9 of insulating material in the mat (or pieces 11 in the non-woven mat) comprising the reinforcing layer. In one embodiment, the voltage variable material 5 impregnates the reinforcing layer 3 so that there is a continuous path 15 of voltage variable material from the top surface 17 to the bottom surface 19 (FIG. 2). The reinforcing layer 3 can be impregnated with the voltage variable material by a variety of methods as will be appreciated by one of ordinary skill in the art such as: dipping the reinforcing layer in voltage variable material then squeezing the reinforcing layer between two rollers; painting or pasting the voltage variable material across the reinforcing layer; casting; calendaring; etc. There should be a sufficient amount of voltage variable material 5 filling the voids 13 to carry voltage spikes or current which occur in an overvoltage condition. The voltage variable material can be continuous across the top and bottom surface of the variable voltage protection component so that the component can be universally used across variable lead patterns on a circuit without precision tooling. Depending on the size of the conductive particles in the voltage variable materials, a small number of conductive particles or a large number may be present in the voids 13. For example, if the conductive particles are relatively large few particles will fit into the voids therefore more will be on the top surface if the variable voltage material is applied on only the top surface. In a like manner, more conductive particles will be on both the top and bottom surface if the variable voltage material is applied to both the top and bottom surfaces. Whereas if the particles are relatively small more particles will pass into the voids.

In another embodiment, the reinforcing layer 3 is embedded in the voltage variable material 5. The reinforcing layer can be imbedded in the voltage variable material by a variety of methods as will be appreciated by those of ordinary skill in the art such as coating a substrate with the voltage variable material then laminating the reinforcing layer into the wet coating; preparing a layer of voltage variable material then pressing the reinforcing layer into the voltage variable material, etc.

The voltage variable characteristics of the variable voltage protection component 1 are determined by the voltage variable material used and the thickness of the component. The greater the thickness the higher the clamp voltage. If a clamp voltage between about 20 to 30 volts is desired a typical thickness 7 for the variable voltage protection component would be 0.8 to 1.0 mils. If a clamp voltage between about 30 to 40 volts is desired a typical thickness would be 1.0 to 2.0 mils. If a clamp voltage between 40 to 70 volts is desired a typical thickness would be 2.0 to 3.0 mils.

FIG. 3 illustrates that insulating spacers 21 such as ceramic or glass spheres can be added to the reinforcing layer 3 (mat or non-woven mat) to more accurately control the thickness 7. In one embodiment of the present invention, the spacers 21 have a uniform size and are uniformly distributed within the voltage variable material 25 such that the spacers 21 span from the top surface 17 to the bottom surface 19 of the voltage variable material 25. If a compressive force is applied to the variable voltage protection component the spacers 21 will act as supports and prevent the voltage variable material from being compressed, thus preventing shorts or reductions in the clamp voltage. In particular, the resistance to pressure is important during processing at the curing temperature. The spacers 21 can be any predetermined size as dictated by the characteristics (i.e., the clamp voltage, etc.) desired for the variable voltage protection component. For example, if a 1 mil thick variable voltage protection component is desired then the spacers should be 0.9 to 1.1 mils, and preferably 1 mil. In general, the spacers for most desirable voltage variable protection components are between 0.2 to 10 mils in width. It is contemplated that the spacers can be other shapes other than spherical. The size and shape of the spacers is also dependent on the size of the metal particles in the voltage variable material.

FIG. 3 further illustrates that the variable voltage protection component 1 can be attached to a conductive ground plane 23 to form a variable voltage protection device 25. The variable voltage protection component can be attached to the ground plane 23 by conductive adhesives, conductive primers, non-conductive primers, direct bonding, etc. In addition, the variable voltage protection component 1 can be attached to the ground plane 23 by processes such as spraying, rolling, spin coating, laminating, molding or extruding. For example, the conductive ground plane 23 can be a predetermined length and the variable voltage protection component 1 can be laminated to the ground plane 23 or the variable voltage protection component 1 and the ground plane 23 can be continuous reels and combined in an extrusion or lamination process.

The conductive ground plane 23 can be any of a variety of electrically conductive materials known to one of ordinary skill in the art such as copper, nickel plated copper, brass, beryllium copper, etc. The conductive ground plane 23 can be flexible (such as a foil) so that it can conform to irregular surfaces.

In yet another embodiment, the conductive ground plane 23 is preferably compressible. With the compressible conductive ground plane 23, the variable voltage protection device 25 can be placed or compressed between an electrical lead and a metal lead, such as an outer cover of a connector without changing the thickness of the variable voltage protection component 1 and thus preventing shorts and ensuring reliable electrical characteristics and clamp voltage. The compressible ground plane 23 can be any of a variety of materials such as conductive polymeric material, conductive silicon epoxy, cured conductive silicone rubber, conductive primers, etc. Preferably, the compressible ground plane is a conductive elastomer or conductive rubber. The compressible conductive ground plane can be either electrically conductive at all voltages or electrically conductive only at high voltages similar to the voltage variable material.

In another embodiment, the conductive ground plane 23 has a compliant consistency on at least one surface so that the variable voltage protection device can conform to irregular surfaces. In addition, the conductive ground plane can have at least one adhesive surface so that the conductive ground plane will adhere to and maintain electrical contact with an electrical component surface. Preferably, the adhesive surface will have "quick stick" capability when it is pressed into place.

FIGS. 4 and 5 illustrate that the reinforcing layer 3 can be comprised of spacers 21 only. In FIG. 4, the spacers 21 extend between the top surface 17 and bottom surface 19 as discussed above to form a reinforcing layer of desired thickness 7. The voltage variable material 5 fills the voids 13 between the spacers to provided a continuous path between the top and bottom surface. In FIG. 5, the spacers 21 act in the same way but are smaller sized spheres which are stacked on top of one another to form the reinforcing layer of desired thickness 7. The spacers 21 can be of any desired shape and size and stacked in as many layers as desired to form the reinforcing layer. It should be noted that in this embodiment of the present invention, the spacers 21 are uniformly stacked and uniformly distributed in the variable voltage protection component 1, as shown with reference to FIG. 5.

The voltage variable material 5 used in accordance with the present invention can be any voltage variable material known in the art, for example those disclosed in either U.S. Pat. No. 4,977,357 (Shrier) or U.S. Pat. No. 4,726,991 (Hyatt et al.), which are incorporated herein by reference. Generally, the voltage variable material comprises a binder and closely spaced conductive particles homogeneously distributed in the binder and spaced to provide electrical conduction. In addition, various material such as that disclosed in U.S. Pat. No. 4,103,274 (Burgess et al.) can be used in accordance with the present invention.

Preferably, however, the voltage variable material 5 can be a voltage variable thick film paste typically comprised of 50% solvent and 50% solids coating, the solid phase of which is comprised of 38% by weight (30% by volume) of conductors such as 10 micron aluminum, 3.5% by weight (3.4% by volume) silica coating for the conductors, and 58.5% by weight (66.6% by volume) of reinforced fluorosilicone polymer whose dielectric breakdown strength has been modified through the addition of antioxidants and stabilizers such as specifically sized aluminum oxide. The size of the aluminum oxide can range from 0.01 to 5 microns. The voltage variable material can also be a solid which is laminated to the reinforcing mat. The voltage variable material can also be prepared as disclosed in commonly assigned U.S. patent application Ser. No. 08/275,154 filed on even date with this application.

The variable voltage protection component 1 of the present invention can be used in a variety of applications. For example, the variable voltage protection component 1 can be used with a conductive ground plane 23 to form a variable voltage protection device 25 to be used in an integrated circuit chip carrier 27 (FIG. 6). The integrated circuit chip carrier 27 contains integrated circuit chip 29. The conductive input/output pads (not shown) of chip 29 are typically wire bonded by wires 31 to conductive leads 33 in the chip carrier 27. The variable voltage protection component 1 contacts the conductive leads 33 of the chip carrier 27 and the conductive ground plane 23 is typically grounded to one or several system grounds in the chip carrier 27 or any other appropriate point in the chip package.

The variable voltage protection device 25 covers a portion of each of the conductive leads 33 of the chip carrier 27 leaving a portion of each conductive lead 33 available for wire bonding of the chip 29 with wires 31. In another embodiment, the conductive leads 33 can be wire bonded to the chip 29 and the variable voltage protection device 25 is a lid that covers chip 29 and the conductive leads 33.

In one embodiment, the variable voltage protection device can be formed on the chip carrier 27 by first placing the variable voltage protection component 1 on the appropriate areas of the conductive leads 33 and then attaching the conductive ground plane 23 to the variable voltage protection component 1. Then connecting the conductive ground plane 23 to a system ground in the chip carrier 27 or any other appropriate point in the chip package, as discussed above. The variable voltage protection device 25 in the chip carrier 27 allows all of the input/output leads to be in contact with the variable voltage protection component 1 which is in turn in contact with the conductive ground plane 23. Therefore, any overvoltage spikes which enter the package through any input/output lead or conductive pad can immediately pass through the variable voltage protection component 1 to the conductive ground plane 23. The variable voltage protection component 1 can be connected to conductive leads 33 by conductive adhesive or other appropriate means. In addition, the variable voltage protection component can be stamped and heat laminated directly to the leads in a manner similar to tape automated bonding.

Another application of the variable voltage protection component 1 of the present invention is any of a variety of electrical connectors such as RJ (i.e., telephone), coaxial, D-Sub (i.e., multiple pin computer cable connectors), 38999 (i.e., aircraft), ARINC, SCSI (small computer systems interface), printed circuit board input/output connectors, chip socket (pin grid arrays, PLCC), etc. The variable voltage protection component is essentially the same in all of the electrical connectors except for the shape such as rectangular for D-Sub or circular for 38999 connectors. In each connector the design will be the same in that there will be a variable voltage protection component in electrical communication with a connector pin on one surface, and in contact with a ground or a conductor that goes to system ground on another surface. Therefore, only the RJ connector will be described for illustrative purposes.

The variable voltage protection component 1 can be used with conductive ground plane 23 to form a variable voltage protection device 25 to be used in an RJ electrical connector 35 (FIG. 7). The RJ electrical connector 35 is comprised of insulating housing 37 having a mating connector opening 39 for receiving a mating connector, such as a telephone jack. The insulating housing 37 also has a variable voltage protection device slot 41 for receiving the variable voltage protection device 25. In the variable voltage protection device slot 41 is a plurality of electrical leads 43. The variable voltage protection device 25 is placed in the variable voltage protection device slot 41 with the variable voltage protection component 1 contacting the electrical leads 43. Forward end 47 of electrical connector housing 45 is inserted in receiving slot 49 and pushed forward until housing cover 51 is located over the variable voltage protection device 25 and guide 53 is fully inserted in guide slot 55. The housing cover 51 can be biased in toward conductive ground plane 23 so that good electrical contact is made. Preferably, conductive ground plane 23 is compressible to prevent pressure being transmitted to the overvoltage protection component 1, thus preventing shorts or variations in the clamp voltage. Any overvoltage spikes which enter the electrical connector 35 through any of the leads 43 can immediately pass through the variable voltage protection component 1 to the conductive ground plane 23, then to the connector housing 45 through housing cover 51 to be shunted off to ground.

In another application, the variable voltage protection component 1 can be used as webbing, tape, a label, or a film (FIG. 8) which can be custom cut to desired lengths for applying to uneven and irregular surfaces, such as on printed circuit boards. The variable voltage protection device comprised of the variable voltage protection component 1 and conductive ground plane 23 can be adhered to a printed circuit board 57 with adhesive tape 59. The variable voltage protection component 1 overlays any number of exposed printed circuit leads 61. A ground 63, such as a wire, conductive epoxy, solder, etc. is connected from a designated ground lead on the printed circuit board to the conductive ground plane 23 through any of the openings 65 in the adhesive tape 59. The opening 65 can also be one continuous slot. An overvoltage spike in any of the printed circuit leads can immediately pass through the variable voltage protection component 1 to the conductive ground plane 23, then be shunted off to ground. In another embodiment, the variable voltage protection component adheres itself to the printed circuit board, so that adhesive tape 59 can be omitted.

The variable voltage protection component can be put into standard packaging components such as small outline, single-in-line packages, and dual-in-line packages for use in printed circuit boards. A small outline package 67 (FIG. 9) is illustrative of each of the packaging styles. The small outline package 67 is comprised of multiple pins 69 with the variable voltage protection component 1 connecting each of the pins. A common conductive ground plane 23 contacts the variable voltage protection component 1. A ground pin 71 is connected to conductive ground plane 23 by connection 73. Standard connecting techniques such as wire bonding, soldering, or conductive epoxy can be used for connection 73. To protect the device a protective covering such as epoxy or standard molding compound can be used to mold around the device to seal the pin-variable voltage protection component-conductive ground plane interfaces to protect the device.

The small outline package 67 is attached in parallel to a printed circuit on a printed circuit boards to provide overvoltage protection to the circuit. In the absence of an overvoltage situation, the small outline package 67 sits passively, not affecting the printed circuit. However, if an overvoltage is present the variable voltage protection component 1 conducts the spike to the system ground through the conductive ground plane 23 and ground pin 71.

FIG. 9A shows a device 68 similar to the small outline package 67, but can be any standard packaging component as discussed above. The device 68 is comprised of multiple input leads 70 on one side of the device and multiple ground leads 72 opposite of the input leads 70. Variable voltage protection component 1 connects the input leads 70 to the ground leads 72. A common conductive ground plane 23 contacts the variable voltage protection component 1. As with the device shown in FIG. 9, the device 68 can be covered with a protective covering such as epoxy or standard molding compound.

The device 68 is attached to a printed circuit in parallel the same as the small outline package 67 discussed above. In the absence of an overvoltage situation, the device 68 sits passively. However, if an overvoltage is present in any of the input leads 70 the variable voltage protection component 1 conducts the spike to the common ground plane 23 then to the system ground from the common ground plane 23 through any or all of the ground leads 72.

As illustrated in FIG. 10, any of the packaged components can be produced in a discrete, semi-automated or fully automated assembly process using a discrete lead frame (typically about 7 inches in length with 40 lead sets or die pads) or a continuous reel lead frame 73. The lead frame acts as a conductive substrate. In one embodiment, the lead frame 73 has feed rails 75 with guide holes 77 for aligning and feeding the lead frame through the manufacturing process. Other aligning and feeding means, as are known by one of ordinary skill in the art, can be used such as stationary guide rails abutting the side of the feed rails 75 and friction wheels pulling or pushing the lead frames through the process.

In one embodiment, the variable voltage protection component 1 is deposited on the lead frame 75. A thin insulating primer can be applied to the lead frame to help the variable voltage protection component adhere to the lead frame, or the variable voltage protection component can be bonded to the lead frame by lamination, conductive adhesives, conductive epoxy, pressure, temperature, spraying, rolling, spin coating, molding, extruding, etc. Then the conductive ground plane 23 is attached to the variable voltage protection component 1. Each of the ground pins 71 is then attached to the conductive ground plane 23 by connection 73. For making device 68, the ground leads are not attached to the ground plane 23. After packaging, each of the lead sets 81 are diced out of the lead frame 75 for forming into the standard packages illustrated in FIGS. 9 and 9A. The lead frame 75 shown in FIG. 10 has eight leads per lead set 81, however, the lead frame can have any number of desired leads.

It is contemplated that the steps just described can be done in differing order, such as the variable voltage protection component 1 can be applied to the conductive ground plane 23 and die stamped-out before being attached to the lead sets (or die pads) 81. Or the conductive ground plane 23 can be connected to the ground pin 71 after the lead sets have been diced from the lead frame 75.

In another embodiment, the method of making the packaged devices can be a fully automated process, such as a spraying, rolling, laminating, or extruding process, in which the lead frames are continuous with multiple lead frame pins 69 perpendicular to the feed rails 77 and the variable voltage protection component 1 is applied to the lead frames. For example, the variable voltage protection component 1 and conductive ground plane 23 can be in continuous tapes that are laminated to the continuous lead frames. Then the assembled components can be divided into a predetermined number of leads. For the device illustrated in FIG. 9, one lead can be selected as the ground pin and connected to the conductive ground plane.

In other embodiments, the lead frame 75 can be a conductive substrate having a predetermined pattern matching the leads on a printed circuit board or the conductive substrate can be a continuous sheet that is photo-etched to form a predetermined pattern to match the leads on a printed circuit board or an integrated circuit. Then the photo-etched areas are filled with voltage variable material.

FIG. 11 shows another application of the present invention, wherein the variable voltage protection device 25 can be used in tape form on an integrated circuit chip lead frame 83. The integrated circuit chip lead frame has a plurality of leads 85 connected to an integrated circuit chip 29 and for connecting to a printed circuit board or multiple chip module. As can be seen in FIG. 12, the variable voltage protection device 25, comprising variable voltage protection component 1 and conductive ground plane 23, is "taped" across the plurality of leads 85. The leads 85 are connected to the chip 29 by wires 31. Each strip of conductive ground plane 23 can be attached to a system ground when the integrated circuit chip lead frame 83 is attached to a printed circuit board or multiple chip module.

In another embodiment utilizing the integrated circuit chip lead frame 83, the variable voltage protection component can be applied across the leads 85 and die pad ground 109 on the bottom of the integrated circuit chip lead frame 83 (FIG. 16). The die pad ground 109 is connected to system ground when the integrated circuit chip lead frame 83 is attached to a printed circuit board or multiple chip module. In this way, when one of leads 85 experiences a voltage spike, the variable voltage protection component 1 conducts the spike laterally through the variable voltage protection component to the die pad ground 109 to protect chip 29. Optionally, ground plane 23 can be added for better performance by the variable voltage protection device. With the ground plane 23 attached, when one of leads 85 experiences a voltage spike, the variable voltage protection component 1 conducts the spike to ground plane 23 then to the die pad ground 109.

In yet another embodiment utilizing an integrated circuit chip lead frame wire bonded by wires 31 to chip 29, the variable voltage protection component can be applied between the leads 85 and die pad ground 109 (FIG. 18). The die pad ground 109 is connected to system ground when the integrated circuit chip lead frame is attached to a printed circuit board or multiple chips module. When any of the leads 85 experiences a voltage spike, the variable voltage protection component 1 conducts the spike to the system ground through die pad ground 109.

A discrete surface mount device 87 is shown in FIG. 13. The device 87 comprises a composite of variable voltage protection component 1 sandwiched between two conductive ground planes 23, and two outer conductive layers 89 for surface mounting the device 87. The layers of the composite can be assembled using a laminating or coating process. A protective coating of epoxy can be applied (such as by painting) to the device 87 to protect the variable voltage protection component 1.

In FIG. 14, the variable voltage protection device 25 is laminated into a printed circuit board 91 having signal leads 93. The variable voltage protection component 1 is applied to or around the signal leads 93. Layers 95 on either side of the variable voltage protection device 25 and signal leads 93 make up the printed circuit board. The conductive ground plane 23 is attached to a system ground. If a signal lead experiences an overvoltage situation, the variable voltage protection component 1 conducts the spike to the conductive ground plane 23 which shunts it off to the system ground.

In another embodiment, the variable voltage protection component 1 can be utilized in a printed circuit board 91 using the vias or through-holes 111 in the printed circuit board (FIG. 17). The vias 111 can be lined with variable voltage protection component 1 that contacts a ground plane 23, and the signal leads 93 in the printed circuit board. It is important that the ground plane 23 terminates at the variable voltage protection component 1. It is also important that the signal leads 93 extend through the variable voltage protection component 1 to contact a layer of conductive material 113, such as solder, which overlays the variable voltage protection component 1. In this way, when a pin (not shown) is inserted in via 111 the pin is in electrical communication with signal lead 93. If signal lead 93 experiences an overvoltage situation, the variable voltage protection component 1 conducts the spike to ground plane 23 which shunts the spike off to system ground.

FIG. 15 shows a device 97 utilizing the variable voltage protection component 1 to contact a predetermined pattern of signal leads 99 and ground leads 101. A conductive strip 103 has a pattern of conductive bumps 105, which are etched, stamped or machined to match a predetermined pattern of ground leads 101. The variable voltage protection component 1 is placed between the conductive bumps 105 is flattened off to be even with the conductive bumps 105. A layer 107 of conductive material, such as conductive epoxy or conductive adhesive, is applied to the conductive bumps 105 and variable voltage protection component 1 to match the predetermined pattern of signal leads 99 and ground leads 101. When one of the signal leads 99 experiences an overvoltage spike, the variable voltage protection component conducts the spike to the conductive strip 103. Then the spike is conducted through the layer 107 of conductive material to the ground leads 101. In addition, layer 107 of the device 97 can be omitted and the variable voltage protection component 1 can be adhered directly to the leads.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A variable voltage protection component for placement between ground and an electronic circuit, the variable voltage protection component having first and second major surfaces and comprising:

a voltage variable material having uniformly
    distributed, electrically inert, nonwoven spacers embedded in the variable voltage material, the spacers being of relatively low compressibility and a diameter of the spacers spanning between the first and second major surfaces of the variable voltage protection component at a uniform distribution and size selected to maintain a substantially constant thickness of the variable voltage protection component, as defined by the separation between the first and second major surfaces, in the presence of compressive forces, thereby reducing the effect of the compressive forces on the electrical behavior of the variable voltage protection component.

2. A variable voltage protection component for placement between a ground and an electric circuit, the variable voltage protection component having first and second major surfaces, and comprising:

a voltage variable material comprising a binder and electrically inert, nonwoven spacers uniformly dispersed within the binder wherein the spacers are of insulating material, are of relatively low compressibility and a diameter of the spacers span from the first the second major surfaces of the variable voltage protection component at a uniform size selected to maintain a substantially constant thickness of the variable voltage protection component, as defined by the separation between the first and second major surfaces, in the presence of compressive forces, thereby reducing the effect of the compressive forces on the electrical behavior of the variable voltage protection component.

3. The variable voltage protection component of claim 2 wherein the non-woven pieces of insulating material comprise balls.

4. The variable voltage protection component of claim 2 wherein the non-woven pieces of insulating material comprise a plurality of pieces of fibrous mat broken, cut or chopped into smaller pieces.

5. The variable voltage protection component of claim 2, wherein the spacers are uniformly distributed within the binder in single units.

6. A variable voltage protection component for placement between a ground and an electronic circuit, the variable voltage protection component having first and second major surfaces and comprising:

a voltage variable material comprising a plurality of discrete, non-woven insulating spacers to provide prescribed thickness dimensions for the variable voltage protection component, the spacers being electrically inert and having relatively low compressibility and a diameter of the spacers spanning between the first and second surfaces of the variable voltage protection component at a uniform distribution and size selected to maintain a substantially constant thickness of the variable voltage protection component, as defined by the separation between the first and second major surfaces, in the presence of compressive forces, thereby reducing the effect of the compressive forces on the electrical behavior of the variable voltage protection component.

7. The variable voltage protection component of claim 6 wherein the insulating spacers are ceramic or glass balls 0.2 to 10 mils in diameter.

8. A variable voltage protection component for placement between a ground and an electronic circuit, the variable voltage protection component having first and second major surfaces and comprising:

a reinforcing layer comprising:

a plurality of pieces of insulating material, said plurality of pieces defining a plurality of voids therebetween and comprising electrically inert, uniformly distributed non-woven spacers being of relatively low compressibility and having a diameter of the spacers spanning the first and second major surfaces of the variable voltage protection component at a uniform distribution and size selected to maintain a substantially constant thickness of the variable voltage protection component, as defined by the separation between the first and second major surfaces, in the presence of compressive forces, thereby reducing the effect of the compressive forces on the electrical behavior of the variable voltage protection component; and a voltage variable material distinct from and impregnating the reinforcing layer and filling the plurality of voids, the voltage variable material comprising a binder, the reinforcing layer being substantially completely surrounded by and suspended in said binder.

9. The variable voltage protection component of claim 8 wherein the voltage variable material is continuous across at least one surface of the variable voltage protection component.

10. The variable voltage protection component of claim 8 wherein the non-woven pieces of insulating material comprise uniformly sized balls.

11. The variable voltage protection component of claim 8 wherein the insulating spacers are ceramic or glass balls 0.2 to 10 mils in diameter.

12. The variable voltage protection component of claim 8 further comprising a conductive ground plane contacting said variable voltage protection component.

\* \* \* \* \*